US010141049B2

(12) United States Patent
Young et al.

(10) Patent No.: US 10,141,049 B2
(45) Date of Patent: Nov. 27, 2018

(54) NONVOLATILE MEMORY SYSTEM STORING SYSTEM DATA IN MARGINAL WORD LINES

(71) Applicant: SANDISK TECHNOLOGIES LLC, Addison, TX (US)

(72) Inventors: Robert George Young, Edinburgh (GB); Neil Darragh, Edinburgh (GB)

(73) Assignee: SANDISK TECHNOLOGIES LLC, Addison, TX (US)

( * ) Notice: Subject to any disclaimer, the term of this patent is extended or adjusted under 35 U.S.C. 154(b) by 85 days.

(21) Appl. No.: 14/577,239

(22) Filed: Dec. 19, 2014

(65) Prior Publication Data
US 2016/0180926 A1    Jun. 23, 2016

(51) Int. Cl.
*G11C 11/56* (2006.01)
*G11C 16/10* (2006.01)
*G11C 16/26* (2006.01)
*G06F 11/10* (2006.01)
*G11C 29/52* (2006.01)
*G06F 3/06* (2006.01)
*G11C 8/08* (2006.01)
*G11C 8/14* (2006.01)
*G11C 29/04* (2006.01)

(52) U.S. Cl.
CPC ........ *G11C 11/5628* (2013.01); *G06F 3/0604* (2013.01); *G06F 3/0659* (2013.01); *G06F 3/0679* (2013.01); *G06F 11/1068* (2013.01); *G11C 8/08* (2013.01); *G11C 8/14* (2013.01); *G11C 11/5642* (2013.01); *G11C 16/10* (2013.01); *G11C 16/26* (2013.01); *G11C 29/52* (2013.01); *G11C 2029/0411* (2013.01)

(58) Field of Classification Search
CPC ............ G06F 11/1068; G06F 11/1072; G06F 11/1008; G06F 11/1076; G06F 3/0679; G06F 3/0659; G06F 3/0604; G11C 29/00; G11C 11/5628; G11C 8/14; G11C 8/08; G11C 11/5642; G11C 16/10; G11C 29/52; G11C 16/26; G11C 2029/0411
USPC ...................................................... 714/773
See application file for complete search history.

(56) References Cited

U.S. PATENT DOCUMENTS

| 6,252,814 | B1 | 6/2001 | Tran |
| 7,535,764 | B2 | 5/2009 | Chin |
| 7,881,114 | B2 | 2/2011 | Park |
| 8,102,705 | B2 * | 1/2012 | Liu ...................... G11C 11/5628 365/185.03 |
| 8,111,548 | B2 | 2/2012 | Mokhlesi |
| 8,732,557 | B2 * | 5/2014 | Ratnam .................. G06F 11/10 714/766 |
| 8,806,113 | B2 | 8/2014 | Lasser |
| 9,021,343 | B1 * | 4/2015 | Hu ....................... G11C 29/785 365/185.03 |
| 9,165,683 | B2 * | 10/2015 | Tam ................. G11C 29/50004 |
| 9,213,601 | B2 * | 12/2015 | Tuers .................. G06F 11/1068 |
| 2012/0307561 | A1 | 12/2012 | Joo |

(Continued)

*Primary Examiner* — Albert Decady
*Assistant Examiner* — Enam Ahmed
(74) *Attorney, Agent, or Firm* — Vierra Magen Marcus LLP

(57) ABSTRACT

To make more efficient use of storage capacity, a nonvolatile storage system will store system data on marginal word lines. In one embodiment, a marginal word line is a word line that is not suitable to store host data because it is not sufficiently reliable for properly programming and reading the host data.

25 Claims, 13 Drawing Sheets

(56) References Cited

U.S. PATENT DOCUMENTS

| | | |
|---|---|---|
| 2013/0166831 A1 | 6/2013 | Atkisson |
| 2013/0314995 A1 | 11/2013 | Dutta |
| 2014/0164878 A1* | 6/2014 | Tam .................... G06F 11/1012 |
| | | 714/773 |
| 2014/0164879 A1* | 6/2014 | Tam .................... G06F 11/1012 |
| | | 714/773 |
| 2014/0279941 A1 | 9/2014 | Atkisson |
| 2014/0281119 A1 | 9/2014 | Hyun |
| 2015/0067245 A1* | 3/2015 | Kruger .................. G06F 3/0634 |
| | | 711/103 |
| 2015/0135039 A1* | 5/2015 | Mekhanik ........... G06F 11/1072 |
| | | 714/773 |
| 2015/0154069 A1* | 6/2015 | Tuers ................. G06F 11/1072 |
| | | 714/773 |
| 2015/0186058 A1* | 7/2015 | Yeh ....................... G06F 3/0619 |
| | | 711/103 |
| 2015/0262714 A1* | 9/2015 | Tuers ............... G11C 29/50004 |
| | | 714/721 |
| 2016/0232088 A1* | 8/2016 | Mohan ................ G06F 12/0246 |

* cited by examiner

|          | S0 | S1 | S2 | S3 | S4 | S5 | S6 | S7 |
|----------|----|----|----|----|----|----|----|----|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

US 10,141,049 B2

NONVOLATILE MEMORY SYSTEM STORING SYSTEM DATA IN MARGINAL WORD LINES

BACKGROUND

Field

The technology described herein relates to non-volatile storage.

Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device, and stores one bit of data per memory cell.

A multi-level flash memory cell is implemented by identifying multiple, distinct allowed threshold voltage ranges in order to store multiple bits of data per memory cell. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090 both describe various data encoding schemes for multi-state flash memory cells.

A non-volatile storage system is typically in communication with (and sometimes embedded within) a host computing device so that the non-volatile storage system can store data for the host computing device. This data is referred to as host data. In addition to host data, non-volatile storage systems will often store system data associated with the host data. System data is data not provided by the host, and used by the memory system for some aspect of memory system operation. Examples of system data include logical block addresses, time, date, temperature, calibration data, read reference voltages, verify reference voltages, and bit error rate. Other system data can also be stored. In some cases, however, storing system data can reduce the capacity of the system to store host data.

DETAILED DESCRIPTION

To make more efficient use of storage capacity, a non-volatile storage system will store system data on marginal word lines. In one embodiment, a marginal word line is a word line that is not suitable to store host data because it is not sufficiently reliable for properly programming and reading the host data. For example, a dummy word line (explained below) or a word line that has been found to have failed (or otherwise has a fault or is predicted to have a fault) is no longer suitable to store host data because it is not sufficiently reliable for properly programming and reading host data. In many cases, the storage system is configured to not write host data to the marginal word line by adding the word line to a table, making the word line address an invalid address, or otherwise adapting the system so that host data is not written to the marginal word line.

Figure 1:
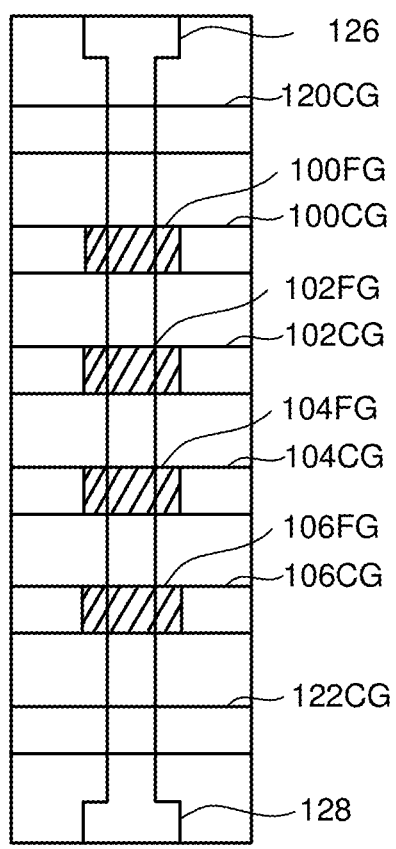
FIG. 1 is a top view of a NAND string.
Figure 2:
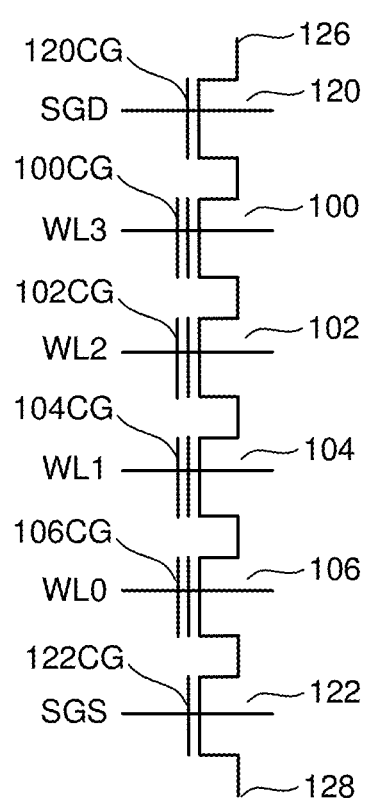
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 3:
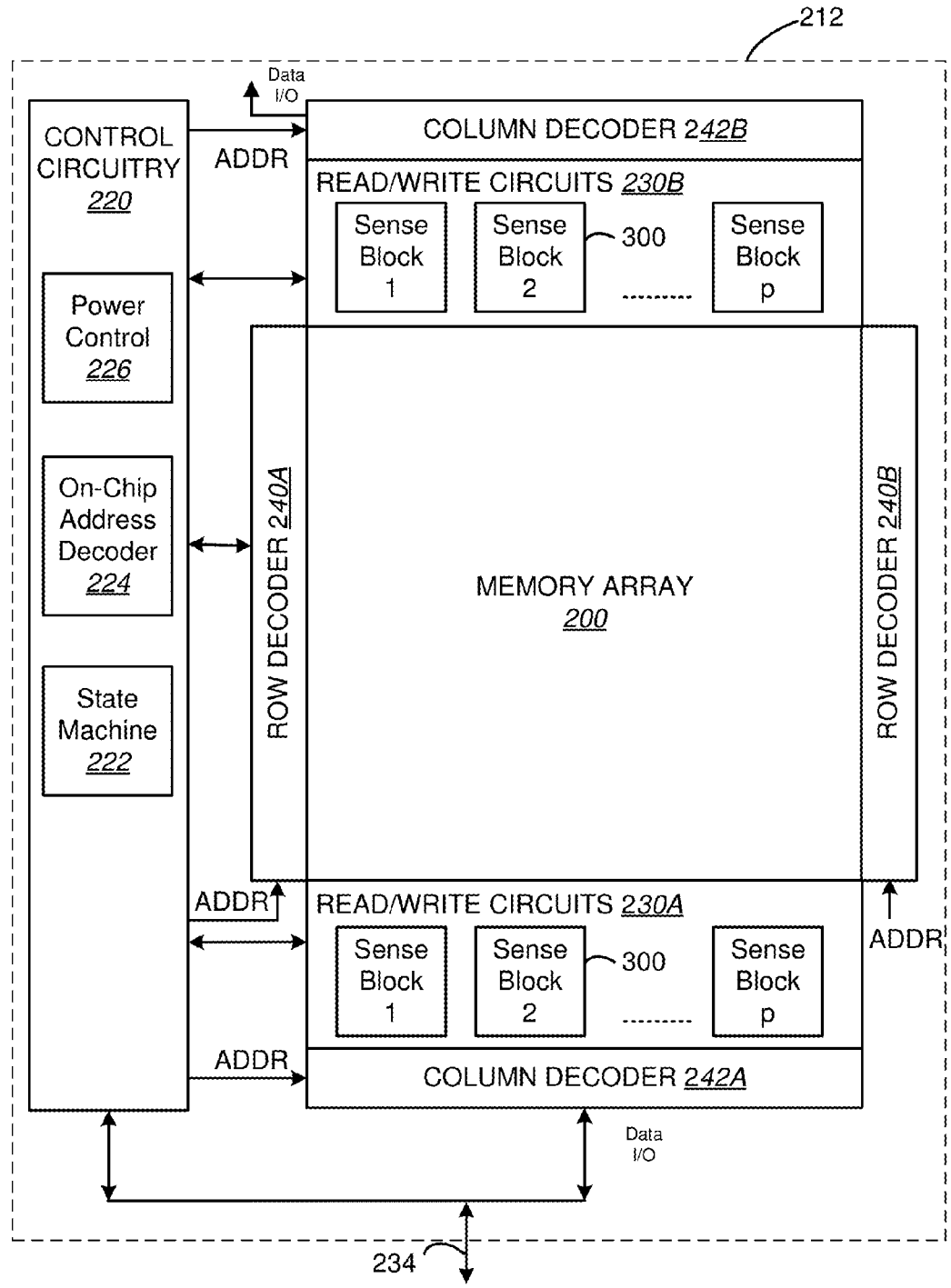
FIG. 3 is a block diagram of a non-volatile memory die.

FIG. 3 illustrates a memory device 212 having read/write circuits for reading and programming one or more pages of memory cells (e.g., NAND multi-state flash memory) in parallel. In one embodiment, memory device 212 is an integrated circuits, referred to as a memory die or memory chip. Memory die 212 includes an array (two-dimensional or three dimensional) of memory cells 200, control circuitry 220, and read/write circuits 230A and 230B. In one embodiment, memory array 200 includes two planes. In one example implementation, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page (or multiple pages) of memory cells to be read or programmed in parallel. The memory array 200 is addressable by word lines via row decoders 240A and 240B and by bit lines via column decoders 242A and 242B. In a typical embodiment, a Controller (not depicted in FIG. 3) is in communication with the memory die 212 via lines 234. Some memory systems may include multiple dies 212 in communication with a Controller. Typically, a Controller includes an ECC (Error Correction Code) engine. In one embodiment, code words are programmed to and read from the memory array 200. The ECC Engine is used to create code words for programming and decode code words form reading according to techniques known in the art. The Controller is in communication with the host computing device for programming host data into memory array 200 and reading host data from memory array 200. In some embodiments, memory cells 200 can be arranged in a structure other than an array.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the Controller, collectively or separately, can be referred to as one or more managing circuits or one or more control circuits.

In one embodiment, the host computing device (also known as a host) is a computing device (e.g., laptop, desktop, smartphone, cellular telephone other than a smartphone, tablet, digital camera, etc.) that includes one or more processors, one or more processor readable storage devices (RAM, ROM, flash memory, hard disk drive, etc.) that store processor readable code (e.g., software) for programming the one or more processors to perform the methods described herein. The host may also include additional system memory, one or more input/output interfaces and/or one or more input/output devices in communication with the one or more processors.

In one embodiment, state machine 222 may be fully implemented in hardware. In another embodiment, state machine 222 may be implemented in a combination of hardware and software. For example, state machine 222 may include one or more processors and one or more processor readable storage devices (RAM, ROM, flash memory, hard disk drive, etc.) that store processor readable code (e.g., software) for programming the one or more processors to perform the methods described herein.

In one embodiment, the Controller may be fully implemented in hardware. In another embodiment, the Controller may be implemented in a combination of hardware and software. For example, the Controller may include one or more processors and one or more processor readable storage devices (RAM, ROM, flash memory, hard disk drive, etc.) that store processor readable code (e.g., software) for programming the one or more processors to perform the methods described herein.

Figure 4:
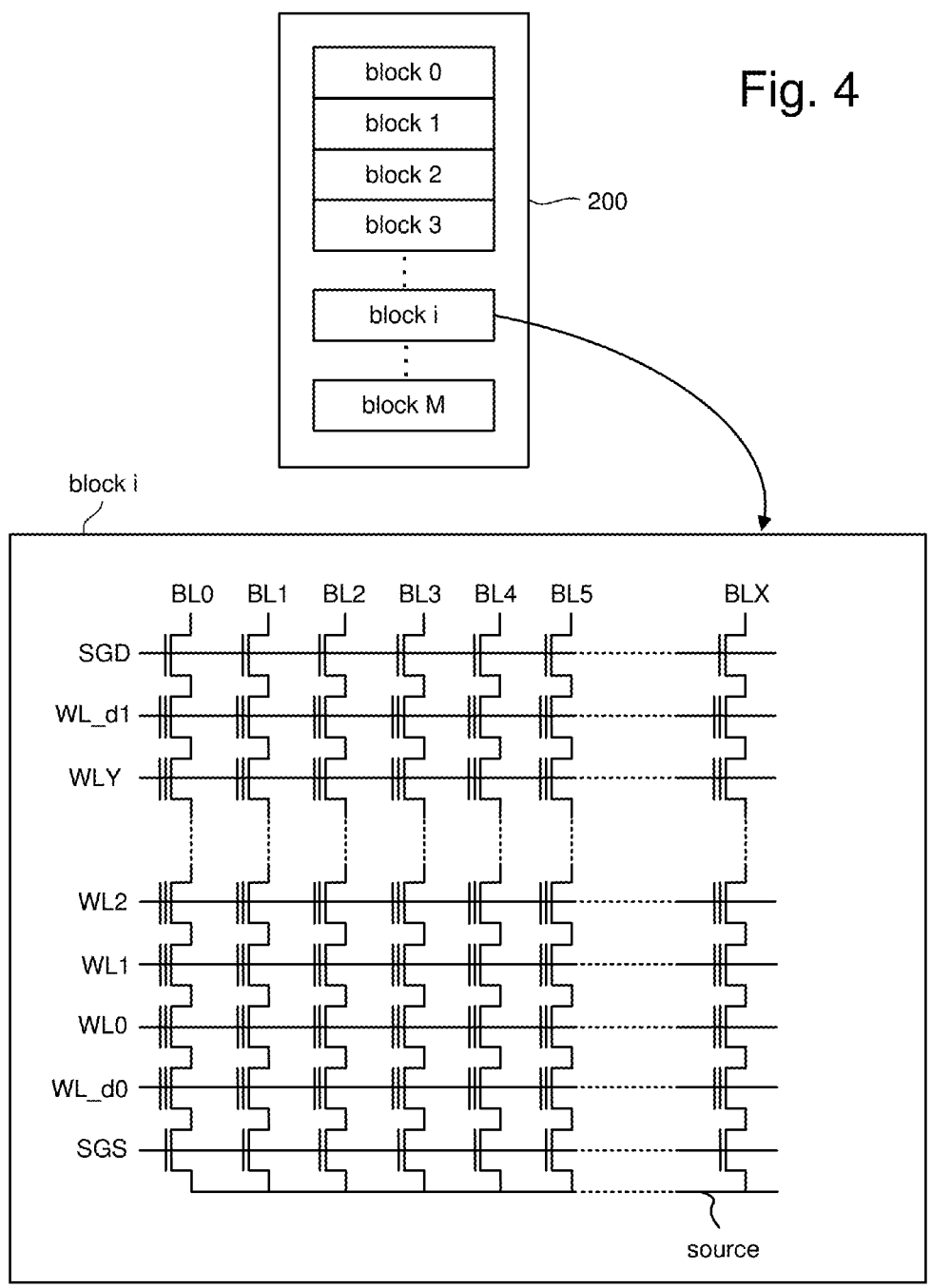
FIG. 4 depicts an exemplary structure of a memory cell array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller calculates the ECC when data is being programmed into the array, and also checks it when data is being read from the array. Alternatively, the ECCs and/or other overhead data can be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized sectors and blocks, as well as different arrangements/architectures, can also be used.

In some embodiments, memory cell array 200 includes two planes, and each plane will include M blocks. Alternatively, each plane can include M/2 blocks, so that the entire memory cell array 200 includes M blocks.

FIG. 4 shows more details of block i of memory cell array 200. Block i includes X+1 bit lines and X+1 NAND strings. Block i also includes Y+1 data word lines (WL0-WLY), 2 dummy word lines (WL_d0 and WL_d1), a drain side select line (SGD) and a source side select line (SGS). The number of data word lines depends on the particular implementation, and no specific number of word lines is needed. Example embodiments include 32, 64, 128, 256 or other number of data word lines.

One terminal of each NAND string is connected to a corresponding bit line via a drain select gate (connected to select line SGD), and another terminal is connected to the source line via a source select gate (connected to select line SGS). Because there are Y+1 data word lines and two dummy word lines, each NAND string includes Y+1 data memory cells and two dummy memory cells. In other embodiments, the NAND strings can have more or less than Y+1 data memory cells and two dummy memory cells. Data memory cells can store host or system data. Dummy memory cells are not used to store host data. Dummy word lines can be used to adjust the resistance of a NAND string. Some embodiments use dummy word lines at the ends of the block because, due to the manufacturing process, the geometry of the end word lines do make the end word lines not suitable to store host data because they not sufficiently reliable for properly programming and reading the host data. One reason for dummy word lines is to isolate blocks. The fact that they are providing this isolation is what makes them prone to disturbs and, therefore, less suitable for storing host data.

The use of error correction coding (ECC) in mass data storage devices and storage systems, as well as in data communications systems, is well known. As fundamental in this art, error correction coding involves the storage or communication of additional bits (commonly referred to as parity bits, code bits, checksum digits, ECC bits, etc.) that are determined or calculated from the "payload" (or original data) data bits being encoded. For example, the storage of error correction coded data in a memory resource involves the encoding of one or more code words that include the host data and the additional code bits, using a selected code. Retrieval of the stored data involves the decoding of the stored code words according to the same code as used to encode the stored code words. Because the code bits "overspecify" the actual data portion of the code words, some number of error bits can be tolerated, without any loss of actual data evident after decoding.

Many ECC coding schemes are well known in the art. These conventional error correction codes are especially useful in large scale memories, including flash (and other non-volatile) memories, because of the substantial impact on manufacturing yield and device reliability that such coding schemes can provide, allowing devices that have a few non-programmable or defective cells to be useable. Of course, a tradeoff exists between the yield savings and the cost of providing additional memory cells to store the code bits (i.e., the code "rate"). Some ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Typically, the error correction codes used in connection with flash memory storage are systematic, in that the data portion of the eventual code word is unchanged from the actual host data being encoded, with the code or parity bits appended to the host data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

Figure 5:
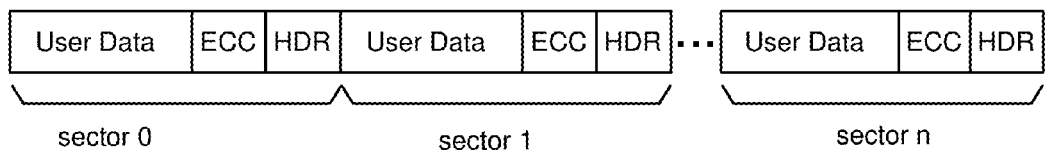
FIG. 5 depicts an exemplary structure of data programmed in the memory cell array.

FIG. 5 depicts a page of data that can be stored in any of the blocks of memory array 200. Depending on the size of the page, the page contains many sectors. Each sector includes user data, error correction codes (ECC), which are the parity bits discussed above, and header information. In one embodiment, a page of data is stored or is to be stored in the memory cells connected to a common word line. For purposes of this document, a "word line unit" is defined to include a word line and the memory cells connected to that word line. Therefore, in one embodiment, a page of data is programmed and stored in a word line unit.

Figure 6:
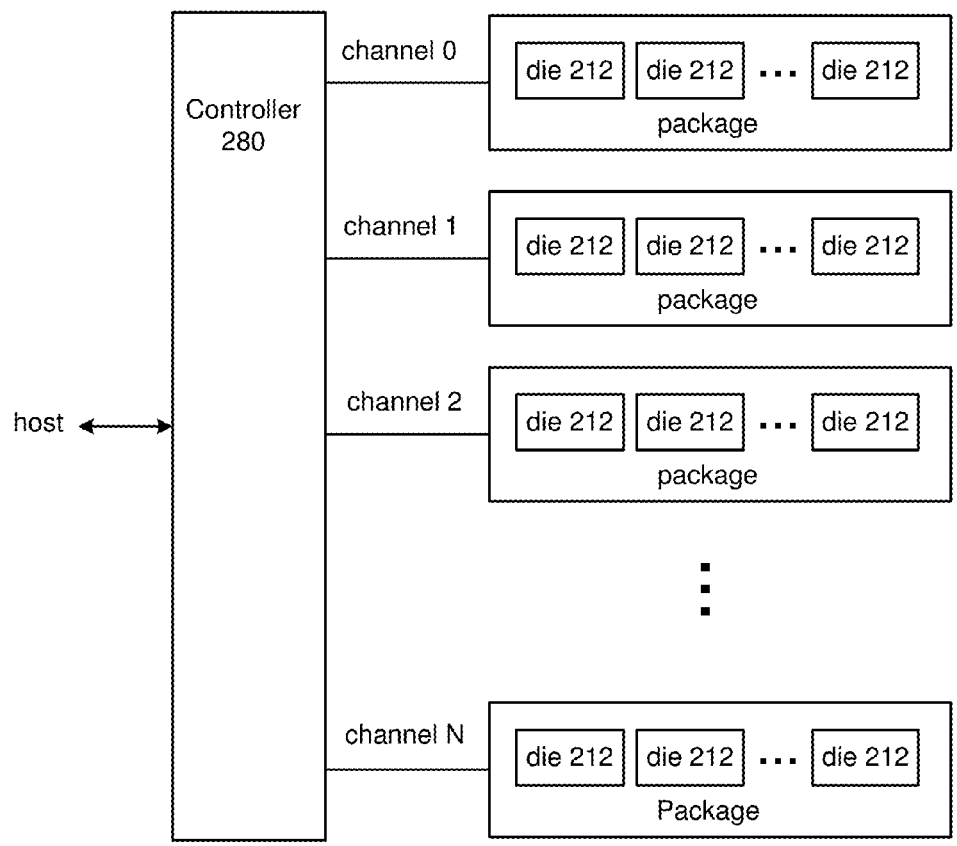
FIG. 6 is a block diagram of a non-volatile memory system.
Figure 7:
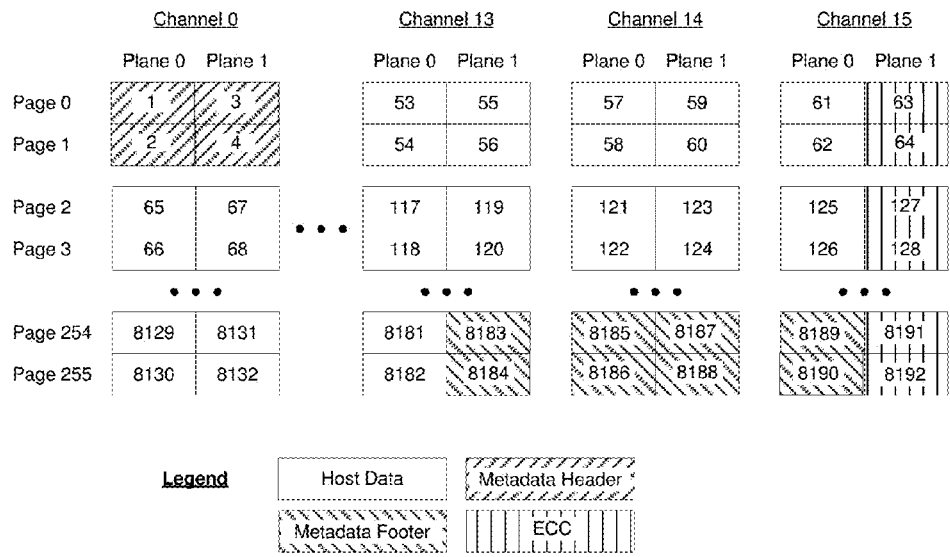
FIG. 7 is a block diagram depicting an example of a super block.

Some embodiments of a non-volatile storage system will include one memory die 212 connected to one Controller. However, other embodiments may include multiple memory die 212 in communication with one or more Controllers. In one example, depicted in FIG. 6, the multiple memory die can be grouped into a set of packages. Each package include one or more memory die in communication with Controller 280. FIG. 6 show N packages, and N channels for communication between Controller 280 and the memory die 212 of respective packages. Controller 280 communicates with the host. In other embodiments, Controller 280 can communicate with any entity via a wired or wireless network (or other type of) connection Controller 280 receives a request from the host to program host data (data received from the host) into the memory system. In some embodiments, Controller 280 will arrange the host data to be programmed into units of data. For example, Controller 280 can arrange the host data into pages, word line units, blocks, super blocks, or other units. Super blocks are units of data that are programmed and read together, but span across multiple memory die 212. In one embodiment, a super block includes two block from one die in each package. The two blocks from one die include one block each from two planes. However, other arrangements can also be used. FIG. 7 is a block diagram depicting one example of a super block for a system with sixteen channels (Channel 0-Channel 15). For each channel, the super block cover two planes of the same die. In the example of FIG. 7, the super block has 255 super pages, with each super page including two physical pages for each die, one for each plane. The physical page is the page depicted in FIG. 5. Therefore, each super page includes thirty two physical pages and a super block has 8192 physical pages (1-8192). FIG. 7 shows that the super block includes four sections: Metadata Header, Host Data, Metadata Footer and ECC. In one embodiment, the ECC include parity bits. In another embodiment, the parity bits are mixed in with the host data. In another embodiment, the ECC for the superblock is a second level of parity bits in addition to the parity bits for individual pages of data. The Metadata Header and the Metadata Footer store system data, including logical block addresses, time, date, temperature, calibration data, read reference voltages, verify reference voltages, and bit error rate. Other system data can also be stored.

In one example, when the host requests data to be programmed, the host will send the data to the Controller. The host will also send a set of logical block addresses (LBAs) in the memory (from the point of view of the host) to store the host data at. The Controller will convert the logical block addresses to physical block addresses (PBAs) in the memory die 212. To help find the host data later, the Controller may keep a table of LBAs to PBAs, may store the LBAs in a header for each physical block or may store the LBAs in headers for each page or sector. In one example, the Metadata Footer (See FIG. 7) stores Logical Block Addresses (LBAs) for all host data in the super block, in addition to the storage LBAs in the other locations mentioned above.

Figure 8:
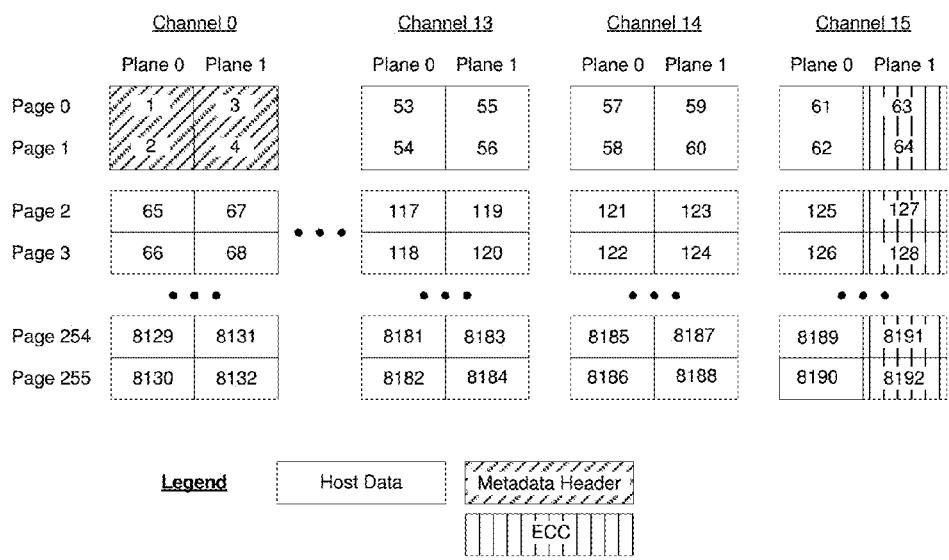
FIG. 8 is a block diagram depicting an example of a super block.

As can be seen, the storage of system data in the Metadata Header and/or Metadata Footer uses storage capacity of the memory that could otherwise be used for host data. Therefore, it is proposed to not store system data (such as in the Metadata Header and/or Metadata Footer) in locations where host data can be stored. Instead, the system data should be stored in location that are unsuitable for host data. One proposal is to store the system data (such as the data previously stored in the Metadata Header and/or Metadata Footer) in memory cells connected to marginal word lines. In other words, store all or a portion of the system data in word line units that contain marginal word lines. In one embodiment, a marginal word line is a word line that is not suitable to store host data because it is not sufficiently reliable for properly programming and reading the host data. For example, a dummy word line (explained below) or a word line that has been found to have failed (or otherwise has a fault or is predicted to have a fault) is no longer suitable to store host data because it is not sufficiently reliable for properly programming and reading host data. In many cases, the storage system is configured to not write host data to the marginal word line by adding the word line to a table, making the word line address an invalid address, or otherwise adapting the system so that host data is not written to the marginal word line. FIG. 8 is a block diagram of the super block of FIG. 7, showing the space for host data has increased (see physical pages 8183, 81814, 8185, 8186, 8187, 8188, 8189 and 8190) because the system data previously stored in the Metadata Footer is no longer stored in locations suitable for host data, rather the system data is stored in word line units having marginal word lines.

Figure 9:
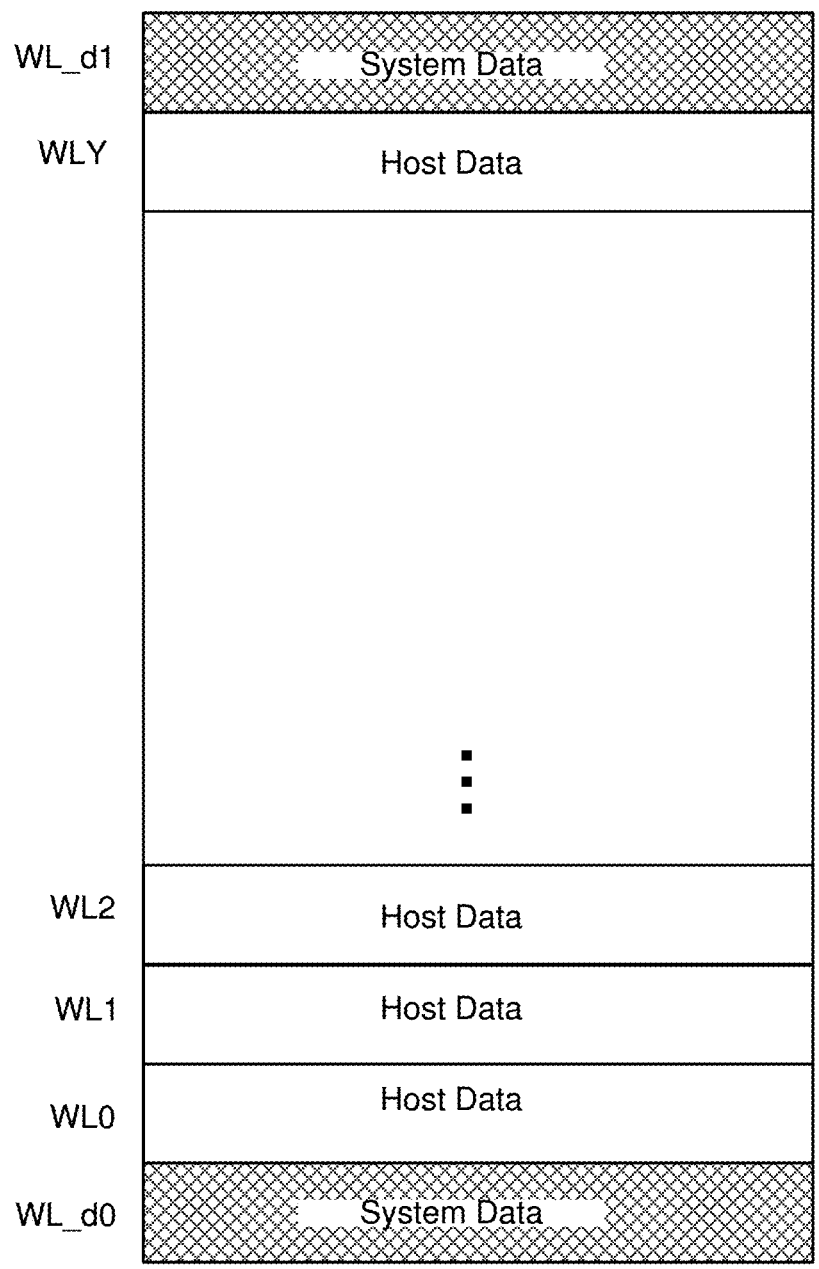
FIG. 9 is a block diagram depicting an example of a physical block.

As mentioned above, one example of a marginal word line is a dummy word line. FIG. 9 is a block diagram of a physical block in a memory die 212, depicting Y+2 word line units. This example, shows system data being stored in word line units for the two dummy word lines WL_d0 and WL_d1, with hosts data in all other word line units (for WL0-WLY). In some embodiments, system data is only stored in a word line unit for one of the dummy word lines (e.g., only WL_d0 or only WL_d1). The dummy word lines are not suitable to store host data because, as discussed above, they are not sufficiently reliable for properly programming and reading the host data In some embodiments, there are no valid addresses for dummy word lines. The valid addresses for host data only include word lines that are not dummy word lines. The Controller is configured to not write host data to the word line unit that includes a dummy word line.

Figure 10:
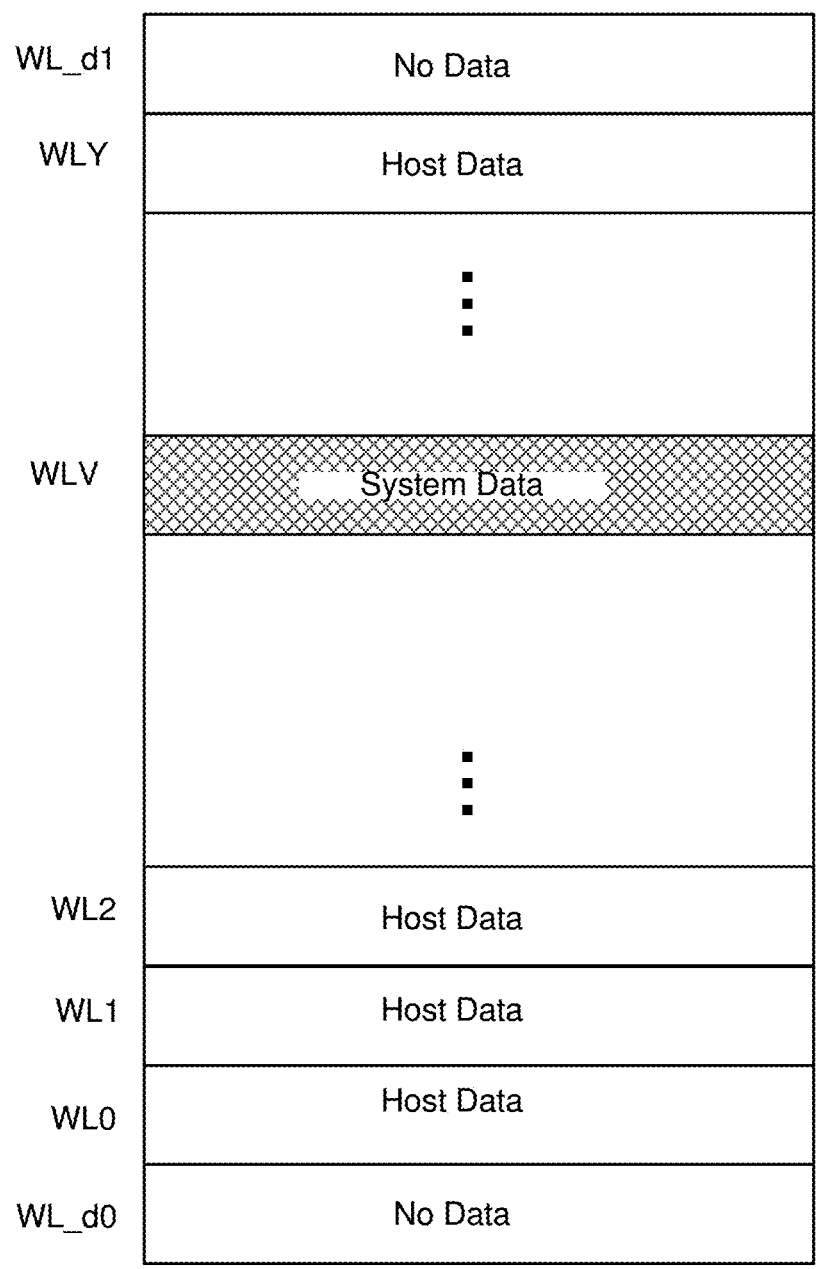
FIG. 10 is a block diagram depicting an example of a physical block.

FIG. 10 is a block diagram of another physical block in a memory die 212, depicting Y+2 word line units. In some embodiments, a memory system is tested prior to delivery to a customer, in response to first use, in response to a request to test or periodically. In the past, if a word line was found to be faulty (shorts, breaks, open circuits, capacitances and other faults) or indicative of a future fault, the entire block is mapped out of the available blocks for host data. In other words, the physical address of the block is no longer a valid address, so that the Controller is configured to not write host data to all of the word line units of the block. However, it is now proposed that the faulty word line be used to store the system data, and the remaining word line units store host data. This has the effect of opening up more line units for host data. For example, FIG. 10 shows word line unit WLV (previously determined to have failed) storing System Data, word line units for WL0-WLV−1 and WLV+1-WLY storing host data and the dummy word lines storing no data. In one alternative, the dummy word lines of FIG. 10 can store system data in the same manner as in FIG. 9.

Since the system data is being stored in word line units for marginal word lines, in some embodiments the system will take additional measures to protect the system data. For example, below are three measures that can be taken to protect the system data stored in word line units for marginal word lines. In different embodiments, all or any subset of the three can be implemented.

First, while host data is stored as multi-level data with multiple bits being stored per memory cell, system data may be stored in word line units for marginal word lines as binary data with one bit being stored per memory cell.

Figure 11:
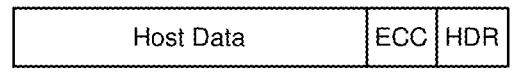
FIG. 11 depicts an example of a page of data.
Figure 12:
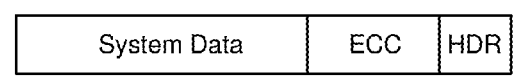
FIG. 12 depicts an example of a page of data.

Second, the Controller can be configured to program the host data using a first error correction coding and program the system data using a second error correction coding that has lower code rate than the first error correction coding. For example, FIG. 11 shows host data programmed using the higher code rate and FIG. 12 shows system data programmed using the lower code rate. As can be seen, the parity bits of the ECC for the system data and the lower code rate is bigger than the parity bits of the ECC for the host data and the higher code rate. Therefore, less system data per page can be stored as compared to host data.

Figure 13:
FIG. 13 depicts an example of data stored in a word line unit.
Figure 14:
FIG. 14 depicts an example of data stored in a word line unit.

Third, Controller will store multiple redundant copies of system data in the same word line unit (or in different word line units). FIG. 13 depicts an example set of data stored in a word line unit (e.g., a page or multiple pages). Multiple redundant copies of the system data SD are stored in the word line unit, with blank spaces M between the multiple redundant copies of system data SD. In other embodiments, there are no gaps between the multiple redundant copies of the system data SD so that the data stored in the word line unit only includes system data with ECC. FIG. 14 depicts another embodiment of a set of data stored in a word line unit (e.g., a page or multiple pages), with blank spaces M between the multiple redundant copies of system data SD. The embodiment of FIG. 14 also include a header HDR in the data. In one embodiment, the header HDR include a unique ID and/or indication that the data is system data to make it easy for the Controller to locate the system data stored in word line units having marginal word lines.

Figure 15:
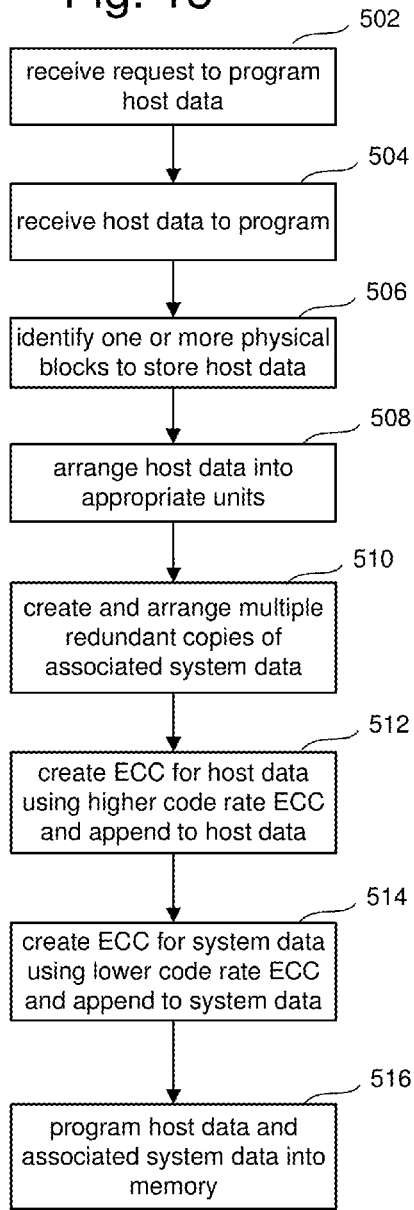
FIG. 15 is a flow chart describing one embodiment of a process for operating a memory system.

FIG. 15 is a flow chart describing one embodiment of a process for operating a non-volatile storage system. In one embodiment, the process of FIG. 15 is performed by the Controller. In other embodiments, all or a portion of the process of FIG. 15 is performed by the host, state machine 222, control circuitry 220 or other component. In step 502, the Controller (or other component) receives a request to program data. That request may include a list of one more LBAs. In step 504, the Controller (or other component) receives the data to be programmed. In step 506, the Controller (or other component) identifies one or more physical blocks in the one or more memory die to store the host data. This includes setting up a mapping between LBAs and physical addresses in the memory. In step 508, the Controller (or other component) arranges the host data into one or more units of data for programming. For example, the host data can be arranged into super blocks, physical blocks, pages, sectors or other units of data. In step 510, the Controller (or other component) makes multiple redundant copies of the system data and arranges the multiple redundant copies of the system data into the unit of data with the host data or in another arrangement (e.g., separate unit of data for separate word line unit). In step 512, an ECC process is performed for the host data using a higher code rate ECC and the parity bits (or other ECC information) are appended to the host data. In step 514, an ECC process is performed for the system data (that will be stored in word line units with marginal word lines) using a higher code rate ECC and the parity bits (or other ECC information) are appended to the system data. In step 516, the Controller (or other component) instructs the relevant memory die to program the unit of data.

Figure 16:
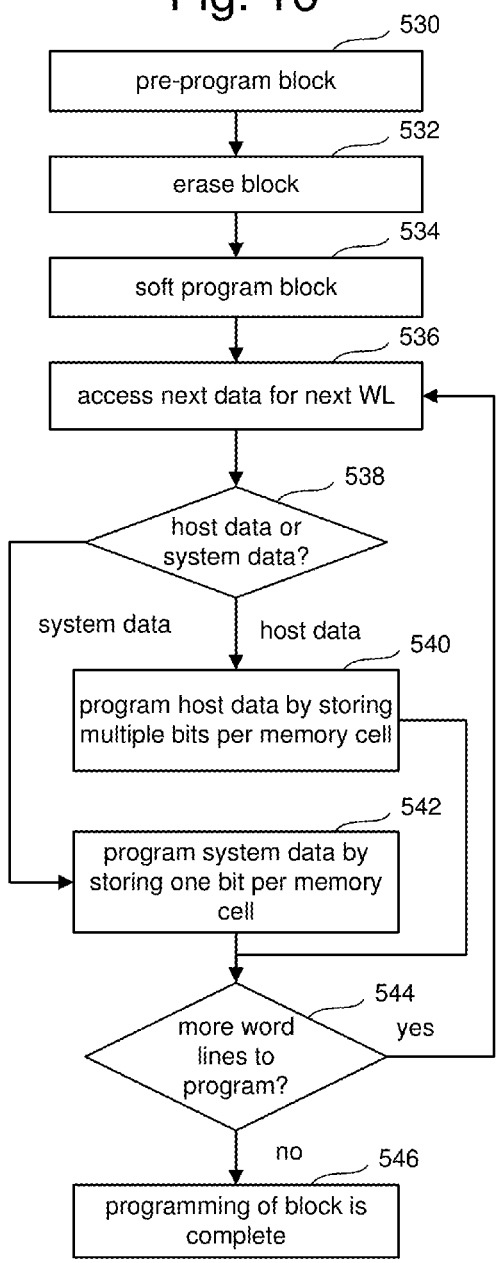
FIG. 16 is a flow chart describing one embodiment of a process for programming.

FIG. 16 is a flow chart describing a process for programming a block of memory. The process of FIG. 16 is performed one or more times by a memory die in response to programming instructions sent from the Controller (or other component) in step 516. In one example implementation, memory cells are pre-programmed in order to maintain even wear on the memory cells (step 530). In one embodiment, the memory cells are preprogrammed to the highest data state, a random pattern, or any other pattern. In some implementations, pre-programming need not be performed. Some embodiments do not implement pre-programming.

In step 532, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 or E (discussed below). One implementation of an erase process includes applying several erase pulses to the p-well and verifying between erase pulses whether the NAND strings are properly erased.

In step 534, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. After step 536, the memory cells of the block are programmed.

In step 536, data (from the unit of data) for the next word line is accessed. If the data to be programmed is host data (step 538), then that host data is programmed to a word line unit as multi-level data with multiple bits being stored per memory cell in step 540. If the data to be programmed is system data (step 538) to be stored in a word line unit for a marginal word line, then that system data is programmed to a word line unit as binary data with one bit being stored per memory cell in step 542. If there are more word lines to program for this block (step 544), then the process loops back to step 536 and access the data for the next word line. If there are no more word lines to program for this block (step 544), then programming for this block is complete (step 546).

Figure 17:
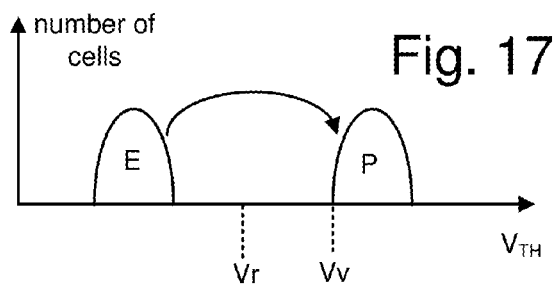
FIG. 17 depicts an example set of threshold voltage distributions and describes a process for programming non-volatile memory.

At the end of a successful programming process, the threshold voltages of the memory cells should be within one or more distributions of threshold voltages for programmed memory cells or within a distribution of threshold voltages for erased memory cells, as appropriate. FIG. 17 illustrates example threshold voltage distributions for the memory cell array when each memory cell stores one bit of data—binary data. FIG. 8 shows two threshold voltage distributions (corresponding to two data states). The first threshold voltage distribution (data state) E represents memory cells that are erased. The second threshold voltage distribution (data state) P represents memory cells that are programmed. The curved arrow indicates the programming process where some memory cells are programmed to go from E to P. In one embodiment, memory cells in data state E store a logical "1" and memory cells in data state P store a logical "0." In one embodiment, the threshold voltages in E are negative and the threshold voltages in P are positive. FIG. 17 also depicts a read reference voltage Vr and verify reference voltage Vv. By testing whether the threshold voltage of a given memory cell is above or below Vr, the system can determine whether the memory cell is erased (E) or programmed (P). When programming memory cells, the system will test whether those memory cells have a threshold voltage greater than or equal to Vv.

Figure 18:
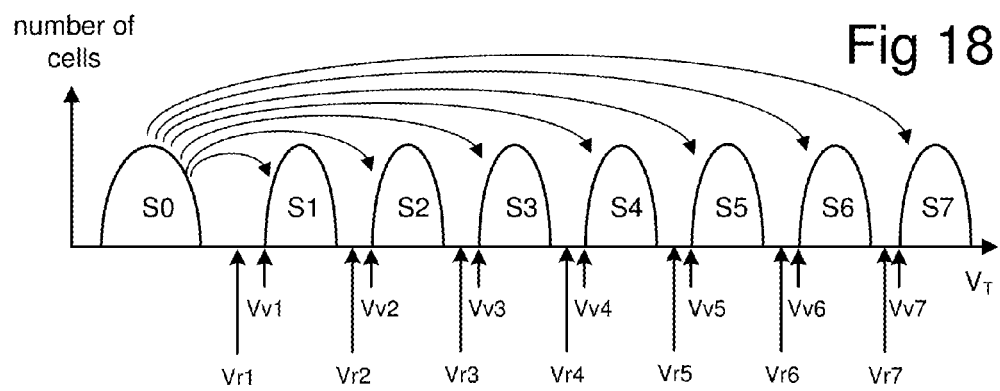
FIG. 18 depicts an example set of threshold voltage distributions and describes a process for programming non-volatile memory.

FIG. 18 illustrates example threshold voltage distributions for the memory cell array when each memory cell stores three bits of data. Other embodiments, however, may use more or less than three bits of data per memory cell (e.g., such as two or four bits of data per memory cell).

In the example of FIG. 18, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, describe various data encoding schemes for multistate flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 9.

FIG. 18 shows a set of verify reference voltages Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify reference voltage Vv2 is used for memory cells being programmed to state S2. Verify reference voltage Vv3 is used for memory cells being programmed to state S3. Verify reference voltage Vv4 is used for memory cells being programmed to state S4. Verify reference voltage Vv5 is used for memory cells being programmed to state S5. Verify reference voltage Vv6 is used for memory cells being programmed to state S6. Verify reference voltage Vv7 is used for memory cells being programmed to state S7.

FIG. 18 also shows a set of read reference voltages Vr1, Vr2, Vr3, Vr4, Vr5, Vr6, and Vr7. These read reference voltages are used as comparison levels during the read process. By testing whether the memory cells turn on or remain off in response to the read reference voltages Vr1, Vr2, Vr3, Vr4, Vr5, Vr6, and Vr7 being separately applied to the control gates of the memory cells, the system can determine for which states that memory cells are storing data.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 9) or verify operation (e.g. see verify reference voltages Vv1, Vv2, Vv3, Vv4, Vv5, Vv6, and Vv7 of FIG. 9) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 19A:
FIGS. 19A-E show various threshold voltage distributions and describe a process for programming non-volatile memory.
Figure 19B:
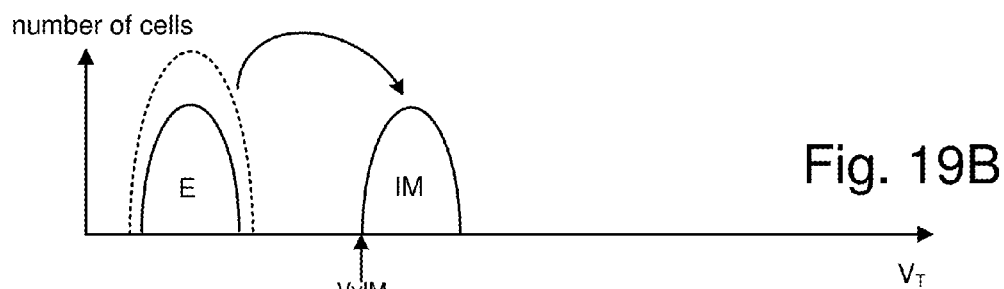

FIG. 18 shows a programming process that includes one phase where all memory cells connected to the same word line are programmed concurrently during that one phase. FIGS. 19A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 19A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 19B. Memory cells being programmed to intermediate state IM are programmed to a verify reference voltage of VvIM.

Figure 19C:
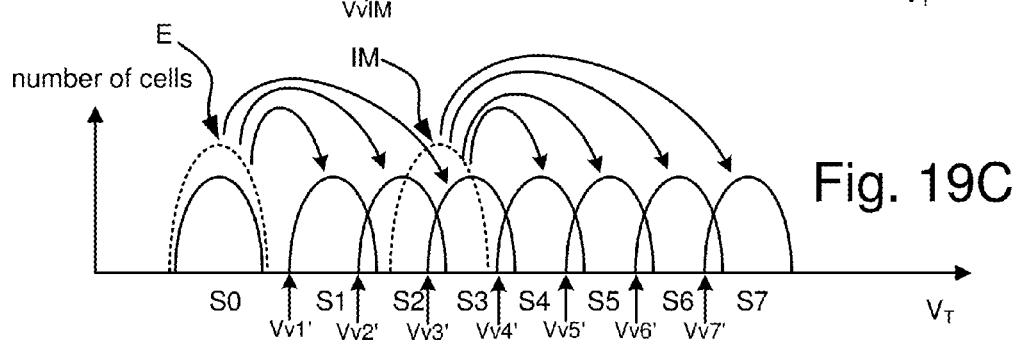
Figure 19D:
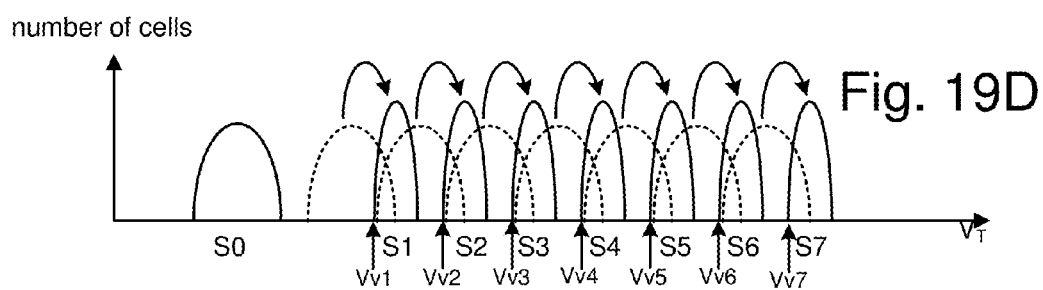
Figure 19E:
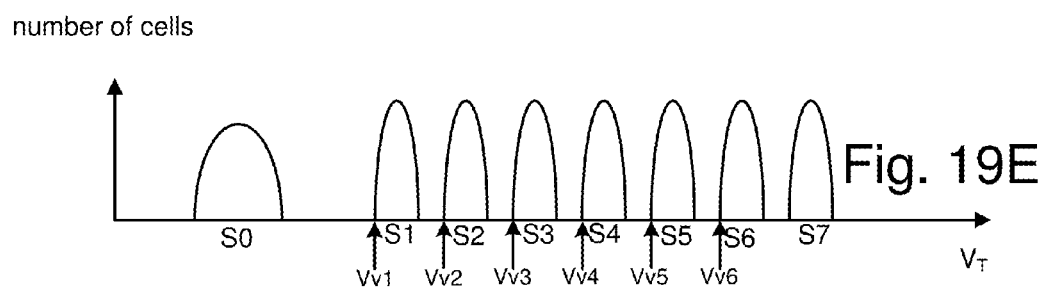

During the second phase of the programming process of FIGS. 19A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 19C.

As can be seen in FIG. 19C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

Figures 19F, 20:
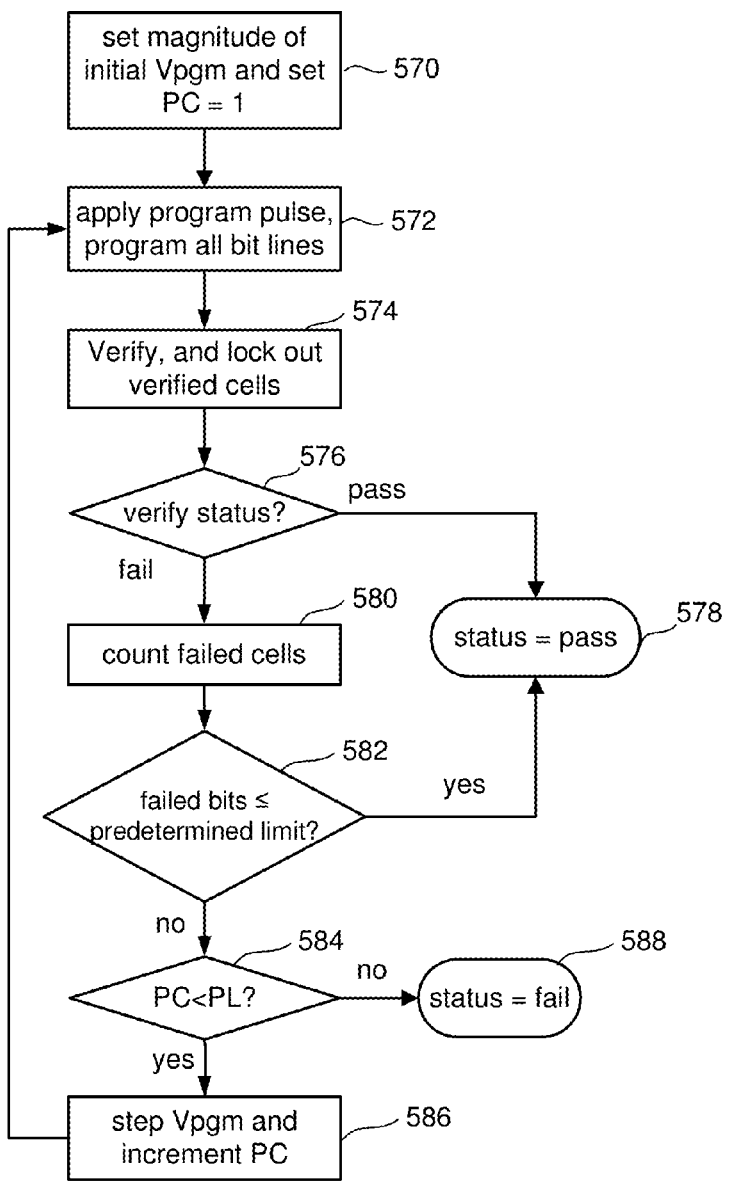
FIG. 19F is a table depicting an example data encoding.
FIG. 20 is a flow chart describing one embodiment of a process for programming non-volatile memory.

In the third phase of programming, each of data states S1-S7 are tightened so that they no longer overlap with neighboring states. This is depicted graphically by FIG. 19D. The final result of the three phrase programming process is depicted in step 19E, which shows data states S0-S7. In some embodiments, data state S0 is wider than data states S1-S7. FIG. 19F shows one example of how data is encoded for the data states of FIGS. 19A-E.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Some embodiments include the first two phases of programming, but not the third phase of programming. In some embodiments, the third phase of programming serves to tighten the threshold voltage distributions, but some or all of the threshold voltage distributions will remain at least partially overlapped with neighboring threshold voltage distributions.

FIG. 20 is a flow chart describing one embodiment of a process for performing programming on memory cells connected to a common word line to one or more targets (e.g., data states or threshold voltage ranges). The process of FIG. 20 can be performed one or multiple times during step 540 and/or step 542 of FIG. 16. For example, the process of FIG. 20 can be used to program memory cells from erased data state E to programmed data state P of FIG. 17; from data state S0 of FIG. 18 to any of data states S1-S7 performing full sequence programming, and any stage of the multi-stage programming process of FIGS. 19A-E.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG. 20, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, in one embodiment, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltages (e.g., Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one embodiment, there is one total count, which reflects the total number of memory cells currently being programmed that have failed the last verify step. In another embodiment, separate counts are kept for each data state. In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Figure 21:
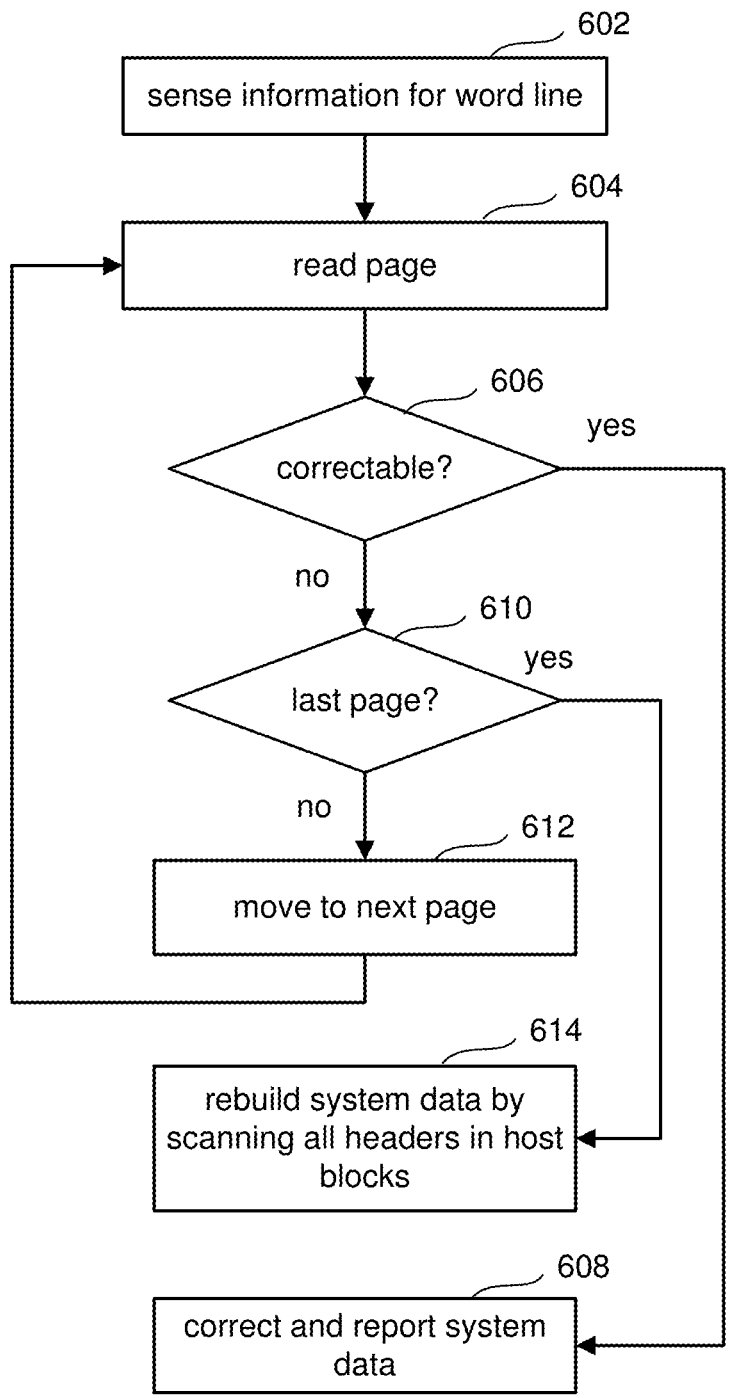
FIG. 21 is a flow chart describing one embodiment of a process for reading system data.

FIG. 21 is a flow chart describing one embodiment of a process for reading system data from word line units that include marginal word lines. In one embodiment, the system data is stored as depicted in FIG. 13 or 14 (or in similar format); therefore, the reading process can take advantage of the multiple redundant copies. In step 602, information is sensed for all memory cells connected to the marginal word line. That is, the system performs a read process according to any of the many read schemes known in the art to attempt to determine what data state (ie state E or state P of FIG. 17) each of the memory cells are in. Looking back at FIGS. 13 and 14, each of the multiple redundant copies of the system data SD is stored in a different page. In step 604, the data for one page is accessed from the sensed information and an ECC decoding process is performed. If the ECC process is successful, all data is correctible (if necessary) and valid data is the result of the ECC process (step 606), then the corrected system data is reported as the result. If the ECC process is not successful and all data is not correctible (step 606), then it is determined whether the data just read is the last page of the marginal word line (step 610). If not, then the next page of system data (the next redundant copy) is accessed in step 612 and the ECC decoding process is performed in step 604. If the ECC process was not able to correct the system data and it is the last page of the marginal word line (step 610), then the data on the marginal word line cannot be read; therefore, the memory will rebuild or recover the system data (if possible) from one or more locations in the memory other than the word line unit that includes the marginal word line (step 614). Portions or all of the system data may have stored in one or more headers of physical bocks, pages or sectors. For example, if the system data includes LBAs, the LBAs are also stored in headers for each physical block. The system can read each physical block of a super block to find out which LBAs are represented in the super block. Often, the other copies of the system data that are recovered in step 614 are broken up and distributed in multiple locations resulting in more work to access the system data.

The technology described herein can apply to different types of system data and different memory architectures.

One embodiment include a non-volatile storage system, comprising: a first non-volatile memory structure that includes a plurality of word line units that each include one word line and a plurality of non-volatile storage elements, the word line units are arranged in blocks, the plurality of word line units include a first word line unit in a first block and a second word line unit in the first block; and one or more control circuits in communication with the first non-volatile memory structure, the one or more control circuits are configured to write host data to the first word line unit, the one or more control circuits are configured to not write host data to the second word line unit, the one or more control circuits are configured to write system data associated with host data to the second word line unit. Note that the use of the words "first" and "second" in the phrases "first word line unit" and "second word line unit" are not intended to suggest a position of the word line units. Instead, the words "first" and "second" are being used as arbitrary labels to merely differentiate between the word line units.

In one example, the second word line unit is not suitable to store host data because of poor reliability of the second word line unit based on one or more physical characteristics of the second word line unit. In one example, the second word line unit is not a valid address to store host data. In one example, the one or more control circuits are configured to recover the system data from one or more locations other than the second word lint unit if the one or more control circuits cannot successfully read the system data from the second word line unit. In one example, the one or more control circuits are configured to write the host data to the first word line unit as multi-level data with multiple bits being stored per non-volatile storage element; and the one or more control circuits are configured to write the system data to the second word line unit as binary data with one bit being stored per non-volatile storage element. In one example, the one or more control circuits are configured to write the host data to the first word line unit using a first error correction coding; and the one or more control circuits are configured to write the system data to the second word line unit using a second error correction coding that has lower code rate than the first error correction coding. In one example, the one or more control circuits are configured to write multiple redundant copies of the system data to the second word line unit. In one example, the one or more control circuits are configured to read the system data by accessing sensed information for the second word line unit, assessing a first page of the sensed information, and attempting to recover a first copy of the multiple redundant copies of the system data using error correction; and the one or more control circuits are configured to assess a second page of the sensed information and attempt to recover a second copy of the multiple redundant copies of the system data using error correction if the first copy cannot be recovered. In one example, the one or more control circuits are configured recover the system data from one or more locations other than the second word lint unit if the first copy cannot be recovered and the second copy cannot be recovered. In one example, the one or more control circuits are configured to write the system data to the second word line unit by programming the system data to non-volatile storage elements connected to a dummy word line. In one example, the one or more control circuits are configured to write the system data to the second word line unit by programming the system data to non-volatile storage elements connected to a word line determined to have failed.

One embodiment includes a method of operating non-volatile storage system, the non-volatile storage system includes word line units that each include a word line and a plurality of non-volatile storage elements, the method comprising: storing host data in a first word line unit of a first block; and storing system data associated with the host data in a second word line unit of the first block, the second word line unit does not store host data, the non-volatile storage system is configured not to write host data to the second word line unit.

One embodiment includes a method of operating non-volatile storage system, the non-volatile storage system includes word line units that each include a word line and a plurality of non-volatile storage elements, the method comprising: storing host data in a first word line unit of a first block; and storing system data associated with the host data in a second word line unit of the first block, the second word line unit does not store host data, the second word line unit is not a valid address to store host data.

One embodiment includes a method of operating non-volatile storage system, the non-volatile storage system includes word line units that each include a word line and a plurality of non-volatile storage elements, the method comprising: storing host data in a first word line unit of a first block; and storing system data associated with the host data in a second word line unit of the first block, the second word line unit does not store host data, the second word line unit is not suitable to store host data because of poor reliability of the second word line unit based on one or more physical characteristics of the second word line unit.

One embodiment includes a non-volatile storage system, comprising: a plurality of memory die, each memory die includes one or more memory structures, each memory structure includes a plurality of word line units that each include a word line and a plurality of non-volatile storage elements; and one or more control circuits in communication with the plurality of memory die via a plurality of channels, each channel connects a subset of the memory die to the one or more control circuits, the one or more control circuits receive host data and create a unit of data that includes the host data and system data associated with the host data, the one or more control circuits program the unit of data across multiple memory die of the plurality of memory die so that the unit of data is stored in a first set of word line units and a marginal word line unit, the marginal word line unit is not suitable to store host data because of poor reliability of the marginal word line unit based on one or more physical characteristics of the marginal word line unit, no host data is stored in the marginal word line unit.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize the technology in various embodiments and with various modifications as are suited to the particular use contemplated. It is intended that the scope be defined by the claims appended hereto.

We claim:

1. A non-volatile storage system, comprising:
   a first non-volatile memory structure that includes a plurality of word line units that each include one word line and a plurality of non-volatile storage elements, the word line units are arranged in blocks, a block is a unit of erase, the plurality of word line units include a first word line unit in a first block and a second word line unit in the first block; and
   one or more control circuits in communication with the first non-volatile memory structure, the one or more control circuits are configured to write host data to the first word line unit, the one or more control circuits are configured to not write host data to the second word line unit, the one or more control circuits are configured to write system data associated with host data to the second word line unit by programming the system data to non-volatile storage elements connected to a word line determined to have failed.

2. The non-volatile storage system of claim 1, wherein:
   the second word line unit is not suitable to store host data because of poor reliability of the second word line unit based on one or more physical characteristics of the second word line unit.

3. The non-volatile storage system of claim 1, wherein:
   the second word line unit is not a valid address to store host data.

4. The non-volatile storage system of claim 1, wherein:
   the one or more control circuits are configured to recover the system data from one or more locations other than the second word lint unit if the one or more control circuits cannot successfully read the system data from the second word line unit.

5. The non-volatile storage system of claim 1, wherein:
the one or more control circuits are configured to write the host data to the first word line unit as multi-level data with multiple bits being stored per non-volatile storage element; and
the one or more control circuits are configured to write the system data to the second word line unit as binary data with one bit being stored per non-volatile storage element.

6. The non-volatile storage system of claim 1, wherein:
the one or more control circuits are configured to write the host data to the first word line unit using a first error correction coding; and
the one or more control circuits are configured to write the system data to the second word line unit using a second error correction coding that has lower code rate than the first error correction coding.

7. The non-volatile storage system of claim 1, wherein:
the one or more control circuits are configured to write multiple redundant copies of the system data to the second word line unit.

8. The non-volatile storage system of claim 7, wherein:
the one or more control circuits are configured to read the system data by accessing sensed information for the second word line unit, assessing a first page of the sensed information, and attempting to recover a first copy of the multiple redundant copies of the system data using error correction; and
the one or more control circuits are configured to access a second page of the sensed information and attempt to recover a second copy of the multiple redundant copies of the system data using error correction if the first copy cannot be recovered.

9. The non-volatile storage system of claim 8, wherein:
the one or more control circuits are configured recover the system data from one or more locations other than the second word lint unit if the first copy cannot be recovered and the second copy cannot be recovered.

10. A method of operating non-volatile storage system, the method comprising:
storing host data in memory cells connected to a first word line of a first block; and
storing system data associated with the host data in memory cells connected to a marginal word line of the first block, memory cells connected to the marginal word line unit do not store host data, the marginal word line is not a valid address to store host data, the marginal word line is known to be a marginal word line prior to the storing system data.

11. The method of claim 10, wherein:
the non-volatile storage system is configured not to write host data to memory cells connected to the marginal word line.

12. The method of claim 10, wherein:
the memory cells connected to the marginal word line are not suitable to store host data because of poor reliability based on one or more physical characteristics of the marginal word line.

13. The method of claim 10, further comprising:
attempting to read the system data from the marginal word line; and
recovering the system data from one or more locations other than the marginal word line if the attempting to read the system data from the marginal word line is unsuccessful.

14. The method of claim 10, wherein:
the storing host data comprises programming the host data as multi-level data with multiple bits being stored per memory cell; and
the storing system data comprises programming the system data as binary data with one bit being stored per memory cell.

15. The method of claim 10, wherein:
the storing host data comprises programming the host data using a first error correction coding; and
the storing system data comprises programming the system data using a second error correction coding that has a lower code rate than the first error correction coding.

16. The method of claim 10, wherein:
the storing system data comprises programming multiple redundant copies of the system data to the memory cells connected to the marginal word line unit.

17. The method of claim 16, further comprising:
reading the system data by accessing sensed information for the memory cells connected to the second word line, assessing a first page of the sensed information, and attempting to recover a first copy of the multiple redundant copies of the system data using error correction; and
assessing a second page of the sensed information and attempting to recover a second copy of the multiple redundant copies of the system data using error correction if the first copy cannot be recovered.

18. The method of claim 10, wherein:
the storing system data comprises programming the system data to memory cells connected to a dummy word line.

19. The method of claim 10, wherein:
the storing system data comprises programming the system data to memory cells connected to a word line determined to have failed.

20. A method of operating non-volatile storage system, the non-volatile storage system includes word line units that each include a word line and a plurality of non-volatile storage elements, the method comprising:
storing host data in a first word line unit of a first block; and
storing system data associated with the host data in a second word line unit of the first block, the second word line unit does not store host data, the second word line unit is not suitable to store host data because of poor reliability of the second word line unit based on one or more physical characteristics of the second word line unit.

21. The method of claim 20, wherein:
the storing host data comprises programming the host data as multi-level data with multiple bits being stored per non-volatile storage element; and
the storing system data comprises programming the system data as binary data with one bit being stored per non-volatile storage element.

22. The method of claim 21, wherein:
the storing host data comprises programming the host data using a first error correction coding; and
the storing system data comprises programming the system data using a second error correction coding that has a lower code rate than the first error correction coding.

23. The method of claim 22, wherein:
the storing system data comprises programming multiple redundant copies of the system data to the second word line unit.

24. A non-volatile storage system, comprising:
a plurality of memory die, each memory die includes one or more memory structures, each memory structure includes a plurality of word line units that each include a word line and a plurality of non-volatile storage elements; and
one or more control circuits in communication with the plurality of memory die via a plurality of channels, each channel connects a subset of the memory die to the one or more control circuits, the one or more control circuits receive host data and create a unit of data that includes the host data and system data associated with the host data, the one or more control circuits program the unit of data across multiple memory die of the plurality of memory die so that the unit of data is stored in a first set of word line units and a marginal word line unit, the marginal word line unit is not suitable to store host data because of poor reliability of the marginal word line unit based on one or more physical characteristics of the marginal word line unit, no host data is stored in the marginal word line unit.

25. The non-volatile storage system of claim 1, wherein:
the one or more control circuits arrange the host data into a super block comprising a plurality of pages and a second level of parity bits, each page includes a first level of parity bits.

* * * * *